United States Patent [19]
Chiba et al.

[11] Patent Number: 5,589,304
[45] Date of Patent: Dec. 31, 1996

[54] PHOTOMASK COMPRISING A HOLDING FRAME AND REINFORCING MEMBER WITH A CERAMIC OXIDE BOND

[75] Inventors: Keiko Chiba, Isehara; Takeshi Miyachi, Zama, both of Japan

[73] Assignee: Canon Kabushiki Kaisha, Tokyo, Japan

[21] Appl. No.: 404,959

[22] Filed: Mar. 16, 1995

[30]  Foreign Application Priority Data

Mar. 16, 1994  [JP]  Japan ................................. 6-046219

[51] Int. Cl.⁶ ............................................. G03F 9/00
[52] U.S. Cl. ........................ 430/5; 430/322; 430/323; 378/34; 378/35
[58] Field of Search ....................... 430/5, 322, 323, 430/324; 378/34, 35

[56]  References Cited

U.S. PATENT DOCUMENTS 5,101,420  3/1992  Kushibiki et al. .................... 430/5
5,199,055  3/1993  Noguchi et al. ..................... 378/35

FOREIGN PATENT DOCUMENTS 90162714   6/1990  Japan.
  466096  10/1992  Japan.
93041347   2/1993  Japan.

*Primary Examiner*—S. Rosasco
*Attorney, Agent, or Firm*—Fitzpatrick, Cella, Harper & Scinto

[57]  ABSTRACT

Disclosed is a mask structure which includes a membrane on which a pattern is formed or to be formed, a holding frame for holding the membrane, and a reinforcing member for reinforcing the holding frame, wherein the reinforcing member comprises ceramics and wherein the reinforcing member and the holding frame are bonded to each other through a film oxide of the ceramics. Also disclosed is a mask structure which includes a membrane on which a pattern is formed or to be formed, a holding frame for holding the membrane, and a reinforcing member for reinforcing the holding frame, wherein the reinforcing member has a major constituent the same as that of the membrane.

8 Claims, 9 Drawing Sheets

PHOTOMASK COMPRISING A HOLDING FRAME AND REINFORCING MEMBER WITH A CERAMIC OXIDE BOND

FIELD OF THE INVENTION AND RELATED ART

This invention relates generally to a photomask. More particularly, the invention is concerned with a mask suitably usable in X-ray lithography or a method of manufacturing such mask. In another aspect, the invention is concerned with an exposure apparatus which uses such mask or a semiconductor device or other device manufacturing method which uses such mask.

The line width of a semiconductor integrated circuit has decreased with am increase in density or speed of the integrated circuit, and further improvements in performance have been required in the semiconductor device manufacturing process. To meet such requirement, as printing apparatuses, steppers which use light of X-ray region (2–20 angstroms) as the exposure wavelength are being developed.

Generally, an X-ray mask to be used in such X-ray exposure apparatus has a structure such as shown in FIG. 10. It comprises an X-ray absorbing material 3, a supporting film 2 for supporting the absorbing material 3, a holding frame 1 for holding the supporting film 2, and a reinforcing member 4 for reinforcing the holding frame 1. Usually, an organic series adhesive agent 5 is used for bonding of the holding frame with the reinforcing member.

In an X-ray mask to be used in an X-ray exposure apparatus which is an apparatus for printing a high density semiconductor integrated circuit, an X-ray absorbing material having a fine line width and the positional precision therefore are required. Where an organic series adhesive agent is used for the bonding of the holding frame with the reinforcing member, changes thereof with time or due to temperature change or humidity change will cause a change in force applied to the holding frame. Finally, the absorbing material will be affected. It is therefore difficult to maintain excellent positional precision of the X-ray absorbing material.

As a bonding method without using an organic series adhesive agent, Japanese Published Patent Application No. 66096/1992 proposes an anode bonding method in which Pyrex glass is used as a reinforcing member. However, glass materials have a low Young's modulus and, if an external force is applied thereto during conveyance within an exposure apparatus or in the chucking operation, a large distortion will be produced which may adversely affect the positional precision.

Japanese Laid-Open Patent Application No. 62714/1990 and No. 41347/1993 propose a direct bonding method wherein Si is used as a reinforcing member. Since Si is single crystal, mechanical machining thereof is difficult To achieve and, thus, the machining operation thereof necessary for conveyance and chucking thereof is difficult to accomplish.

SUMMARY OF THE INVENTION

It is accordingly an object of the present invention to provide a mask or a mask manufacturing method by which the problem described above is solved or reduce.

In accordance with an aspect of the present invention, there is provided a mask, comprising a membrane on which a pattern is formed or to be formed; a holding frame for holding said membrane; and a reinforcing member for reinforcing said holding frame; wherein said reinforcing member comprises ceramics and wherein said reinforcing member and said holding frame are bonded to each other through a film oxide of the ceramics. That is, ceramics having a high Young's modulus and being easy to be mechanically machined is used as the material of the reinforcing member and, without using an organic series adhesive agent, the reinforcing member is bonded with the holding frame through a film oxide of the ceramics. As a result, even if an external force is applied thereto during conveyance or in the chucking operation, no distortion is produced such that high positional precision is maintained.

In accordance with another aspect of the present invention, there is provided a mask, comprising: a membrane on which a pattern is formed or to be formed; a holding frame for holding said membrane; and a reinforcing member for reinforcing said holding frame; wherein said reinforcing member has a major constituent the same as that of said membrane. This arrangement enables firmer bonding.

In accordance with a further aspect of the present invention, there is provided an exposure apparatus, comprising: means for holding a mask such as described above and for holding a wafer; and means for projecting an exposure energy to the mask and the wafer, by which the pattern of the mask is transferred to the wafer. This enables high precision printing operation.

In accordance with a still further aspect of the present invention, there is provided a device manufacturing method which includes a step of projecting an exposure energy to a mask such as described above, whereby the pattern of the mask is transferred to a wafer. This enables manufacture of high performance devices.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
FIGS. 1A–1H are schematic views for explaining the manufacturing processes of an X-ray mask structure according to the present invention.

Preferred embodiments of the present invention will now be described with reference to examples of a mask to be used in X-ray lithography. However, in the present invention, use of the wavelength of X-rays is not essential. A mask of a similar structure may be used with other wavelength exposure energy such as vacuum ultraviolet rays, for example.

First, since an X-ray supporting film (membrane) should have a sufficient transmissivity to X-rays and should stand by itself, preferably it may have a thickness in a range of 0.1–10 microns. For example, it may be made from a know material of a single film or a composite film of an inorganic film such as Si, $SiO_2$, SiN, SiC, SiCN, BN or AlN, for example, and a radiation resistive organic film such as polyimide, for example.

Second, an X-ray absorbing material for defining a pattern should have a sufficient X-ray absorbency and should be easy to be machined. Preferably, it may have a thickness in a range of 0.1–1.0 micron. For example, it may be made of heavy metal such as Au, W, Ta or Pt, for example, or of a composite of them.

A holding frame for holding the X-ray supporting film may be made from a silicon wafer, for example. The mask may be provided with a protection film for the X-ray absorbing material, an electrically conductive film and/or an anti-reflection film to alignment light, for example.

The holding frame is provided with a reinforcing member for reinforcing the same. The reinforcing member may be made of ceramics. More specifically, a ceramics having a Young's modulus not less than 100 GPa (preferably not less than 150 GPa and more preferably not less than 250 GPa) and a linear expansion coefficient not greater than $1\times10^{-5}K^{-1}$ (preferably not greater than $1\times10^{-6}K^{-1}$) may be used. Practically, those which are easy to be machined for the purpose of conveyance and chucking are preferable. Specifically, the reinforcing member may be made of ceramics of any one of SiC, SiN, AlN, BN, $Al_2O_3$, $ZrO_2$, SiC—$ZrB_2$, $Al_2O_3$—TiC, $Al_2O_3$—$TiO_2$, AlN—BN, $Si_3N_4$—BN, Sialon (Si—Al—O—N) and CORDIERITE (trade mark), having properties as indicated in Table 1. Particularly, AlN—BN, $Si_3N_4$—BN and SiC are preferable since they are easy to be mechanically machined.

The reinforcing member is machined as required for the conveyance and chucking and, simultaneously, the surface thereof to be related to the bonding is polished. While the surface may desirably be in good condition, it may be polished to a flatness no less than 1 micron. The ceramics material may be processed in an air or an oxygen ambience at a high temperature of 800°–1500° C. (preferably 1000°–1200° C.) for one or a few hours, by which an oxide may be produced on its surface. Then, this reinforcing member may be placed on the holding frame, and they are processed at a temperature of 300°–1000° C. for one or a few hours, by which they may be bonded with each other. Here, when the holding frame and the reinforcing member placed one upon another, they may be pressed. To this end, a pressure of 0.5–10.0 $Kg/cm^2$ (preferably 1.0–5.0 $Kg/cm^2$) may be applied. At this time, it is not always necessary that the supporting film has been formed on the holding frame. Also, this may be done after a window for transmission of X-rays is formed in the holding free. Further, the reinforcing member may be used as a protection film during formation of the window in the holding frame. Where the supporting film is to be formed before bonding the reinforcing member with the holding frame and, if the supporting film is formed through a chemical vapor deposition (CVD) process, a similar supporting film is produced also on the bottom surface of the holding frame (the surface to be bonded with the reinforcing member). Such a supporting film may be removed or it may be left there provided that it does not affect the bonding. When the major constituent of the supporting film consists of the same material as of the reinforcing member, firmer bonding is attainable. Specifically, it may preferably use ceramics of any one of SiC, SiN, AlN, BN and $Al_2O_3$, for example.

TABLE 1

| MATERIAL | YOUNG'S MODULUS (GPa) | LINEAR EXPANSION CO-EFFICIENT($K^{-1}$) |
| --- | --- | --- |
| Pyrex* | 62 | $2.8 \times 10^{-6}$ |
| Si{111}* | 170 | $2.6 \times 10^{-6}$ |
| Si{100}* | 150 | $2.6 \times 10^{-6}$ |
| Alumina($Al_2O_3$) | 370 | $7.0 \times 10^{-6}$ |
| Zirconia($ZrO_2$) | 150 | $10.0 \times 10^{-6}$ |
| Cordierite (2MgO—2$Al_2O_3$—5$SiO_2$) | 110 | $3 \times 10^{-6}$ |
| Sialon(Si—Al—O—N) | 270 | $3 \times 10^{-6}$ |
| Silicon carbide(SiC) | 400 | $4 \times 10^{-6}$ |
| Aluminum nitride (AlN) | 280 | $4 \times 10^{-6}$ |
| Silicon nitride($Si_3N_4$) | 170–300 | $3 \times 10^{-6}$ |
| Boron nitride(BN) | 700 | $4 \times 10^{-6}$ |
| SiC—$ZrB_2$ | 360 | $5.3 \times 10^{-6}$ |
| $Al_2O_3$—TiC | 390–410 | $7.8 \times 10^{-6}$ |
| $Al_2O_3$—$TiO_2$ | 220 | $8.0 \times 10^{-6}$ |
| AlN—BN | 160 | $4.4 \times 10^{-6}$ |
| $Si_3N_4$—BN | 130–160 | $2.5 \times 10^{-6}$ |

*: conventional material

[Embodiment 1]

Figure 1B:
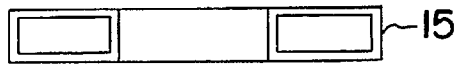
Figure 1C:
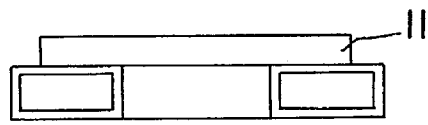
Figure 1D:
Figure 1E:
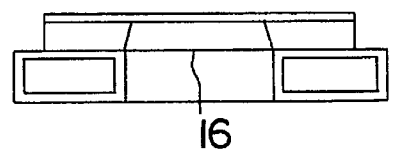
Figure 1F:
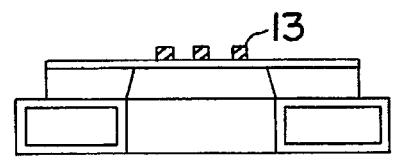
Figure 1G:
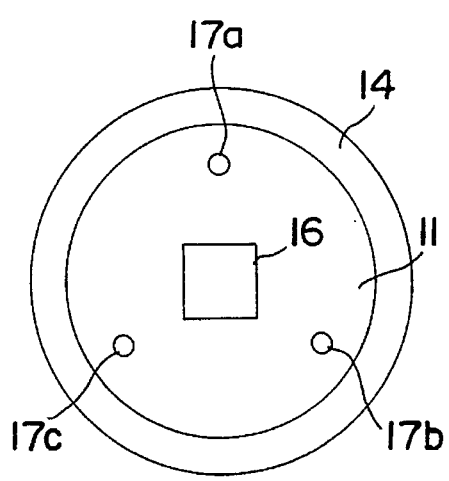
Figure 1H:
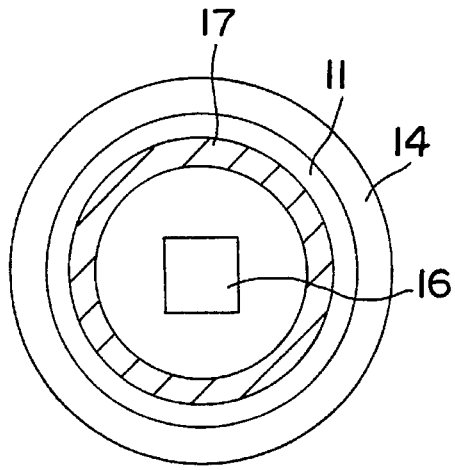
Figure 2:
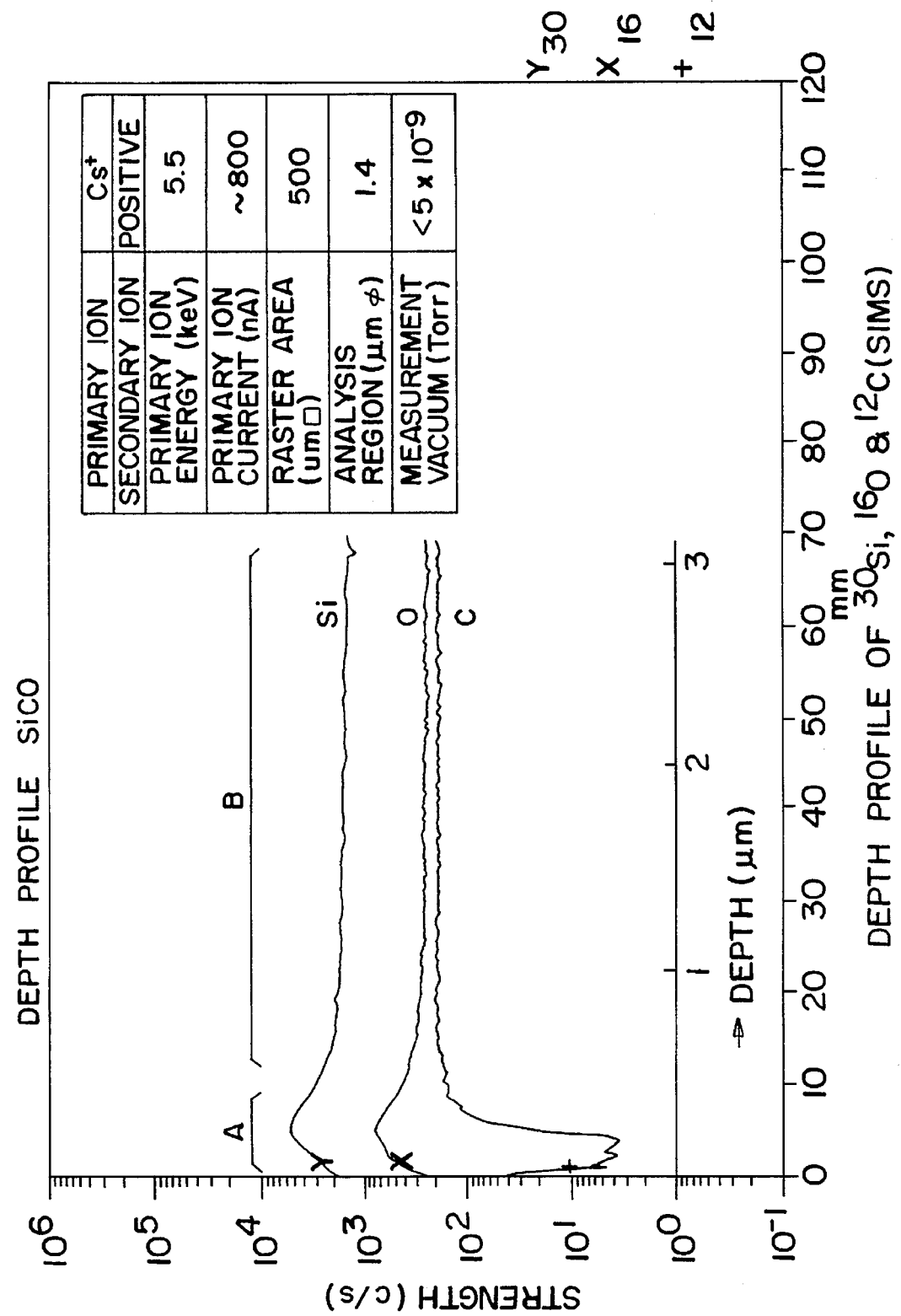
FIG. 2 is a graph for explaining the results of SIMS analysis of a reinforcing member of an X-ray mask structure according to the present invention.
Figure 3:
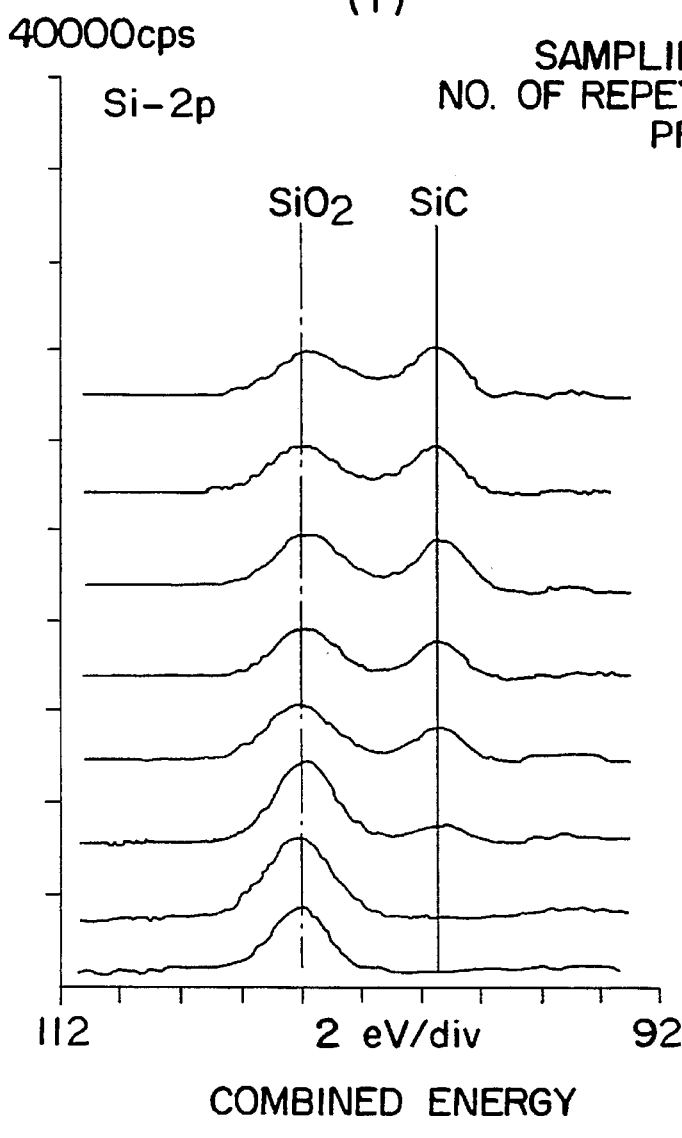
FIG. 3 is a graph for explaining the results of ESCA analysis of a reinforcing member of an X-ray mask structure according to the present invention.

FIGS. 1A–1H are schematic and sectional views for explaining manufacturing processes of an X-ray mask structure according to an embodiment of the present invention. As shown in FIGS. 1A, 1G and 1H, a reinforcing member 14 comprises a frame member of ring-like shape, and it was made of sintered SiC in this embodiment. While it has a round ring-like shape as illustrated, it may be of a rectangular shape. The central window thereof may be of a circular shape or of a rectangular shape, provided that it has a sufficient area for transmission of X-rays therethrough. Also, while not shown in the drawings, the reinforcing member had been machined and shaped for convenience of conveyance and chucking of the same. The reinforcing member 14 was heat processed in an air ambience at a temperature of 1200° C. for five (5) hours, and a film oxide 15 (SiC oxide) was produced on it surface (FIG. 1B). A few microns at the surface mainly consisted of $SiO_2$. The results of SIMS and ESCA analyses are shown in FIGS. 2 and 3.

Then, Si substrate 11 to be formed into a holding frame and the reinforcing member 14 having the film oxide 15 formed thereon were placed one upon another, and they were pressed at 1.0 $Kg/cm^2$ and were heat processed at 500° C. for three (3) hours (FIG. 1C). As regards the bonding area, although these elements may be bonded at the entire surface thereof, the bonding may be made only in a portion of the reinforcing member surface such as at three points 17a, 17b and 17c shown in FIG. 1G or along a line such as shown at 17 in FIG. 1H. In the latter cases, the strength of bonding may be slightly lower than that of the whole surface bonding, but the machining precision of the surface roughness increases. Thus, the former and latter cases may provide approximately the same results. Further, in the latter cases, distortion due to the bonding is small.

Then, on the Si substrate, a film of SiN was formed to a thickness of 2.0 microns through the CVD process (FIG. 1D) and, while using the reinforcing member 14 as a protection film, only an area 16 of the Si substrate 11 corresponding to the X-ray transmitting area was back etched by KOH (FIG. 1E).

Subsequently, by using a sputtering apparatus, a film of W (to be formed into X-ray absorbing material 13) was formed to a thickness of 0.8 micron and, by using an electron beam EB) pattern drawing apparatus, a desired pattern was formed. Then, an etching process using $SF_6$ gas was performed, whereby the X-ray absorbing material pattern 13 was produced (FIG. 1F). The back etching of the Si substrate 11 may be made after the W film formation or after the pattern formation. Also, the film W may be one as having been formed through CVD or it may be a composite such as $WN_x$, for example.

With the bonding of (he reinforcing member such as described above, an X-ray mask without distortion during the chucking operation or conveyance operation and being stable with respect to time or temperature and/or humidity and thus having a high positional precision, was provided.
[Embodiment 2]

FIGS. 4A–4F are schematic and sectional views for explaining manufacturing processes of an X-ray mask structure according to a second embodiment of the present invention.

Figure 4A:
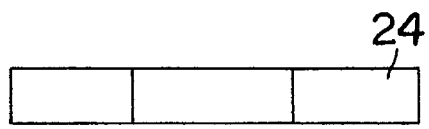
FIGS. 4A–4F are schematic views for explaining the manufacturing processes of an X-ray mask structure according to another embodiment of the present invention.
Figure 4B:
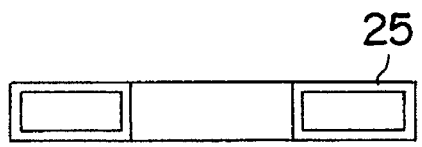

Reinforcing member 24 has a frame member having a window in its central port,on as shown in FIG. 4A, and it was made of sintered SiC in this embodiment. While not shown in the drawings, the reinforcing member had been machined and shaped for convenience of conveyance and chucking of the same. The reinforcing member 24 was heat processed in an air ambience at a temperature of 1200° C. for five (5) hours and a film oxide 25 (SiC oxide) was produced on it surface (FIG. 4B).

Figure 4C:
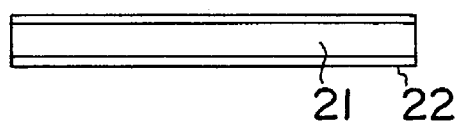
Figure 4D:
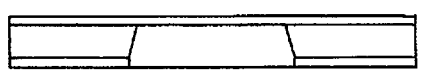

Then, upon Si substrate 21 to be formed into a holding frame 21, a film of SiC (to be formed into a supporting film (X-ray transmission film 22)) was formed to a thickness of 2.0 micron. Simultaneously, on the bottom surface of the Si substrate 21, a SiC film was produced (FIG. 4C). By using the SiC film at the bottom surface as a protection film, only an area of the Si substrate 21 corresponding to the X-ray transmission area was back etched by KOH (FIG. 4D). Where the supporting film 21 is made of a material such as SiN different from that of the reinforcing member 24, a SiC film may be formed only on the bottom surface thereof.

Figure 4E:
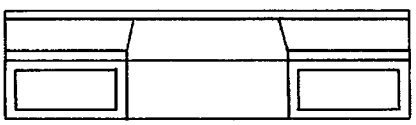

Then, the Si substrate 21 and the reinforcing member 24 having the film oxide 25 formed thereon were placed one upon another, and they were pressed at 1.0 Kg/cm² and were heat processed at 300° C. for five (5) hours, without pressure application (FIG. 4E). The bonding was done through the production of $SiC_xO_y$ between the SiC films, and firmer bonding was assured.

Figure 4F:
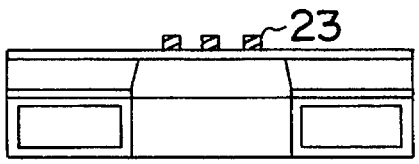

After formation of plating electrodes, an electron beam resist was used and a desired pattern was formed through an electron beam pattern drawing apparatus. Then, Au plating was performed, and the electrodes and the resist material were removed, such that the X-ray absorbing material 23 of Au was formed (FIG. 4F).

With the bonding of the reinforcing member such as described above, an X-ray mask without distortion during the chucking operation or conveyance operation and being stable with respect to time or temperature and/or humidity and thus having a high positional precision, was provided.
[Embodiment 3]

FIGS. 5A–5F are schematic and sectional views for explaining manufacturing processes of an X-ray mask structure according to a third embodiment of the present invention.

Figure 5A:
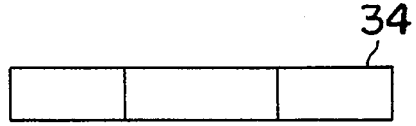
FIGS. 5A–5F are schematic views for explaining the manufacturing processes of an X-ray mask structure according to a further embodiment of the present invention.
Figure 5B:
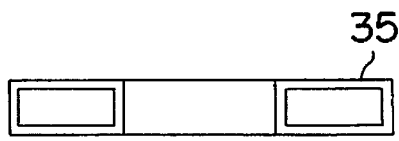

Reinforcing member 34 has a frame member having a window in its central portion as shown in FIG. 5A, and in this embodiment it was made of Riverceram (trade mark of Kawasaki Seitetsu, Japan: $Si_3N_4$—BN series ceramics) having a linear expansion coefficient close to that of Si. While not shown in the drawings, the reinforcing member had been machined and shaped for convenience of conveyance and chucking of the same. The reinforcing member 34 was heat processed in an oxygen ambience at a temperature of 1000° C. for eight (8) hours, and a film oxide 35 was produced on it surface (FIG. 5B).

Figure 5C:
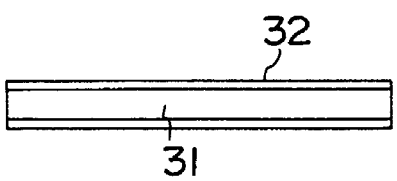

Then, upon Si substrate 31 to be formed into a holding frame 31, a film of SiN (to be formed into a supporting film (X-ray transmission film 32)) was formed to a thickness of 2.0 micron (FIG. 5C). Where the supporting film formation is done through sputtering, for example, the supporting film 32 is formed only on one side surface of the Si substrate 31.

Figure 5D:
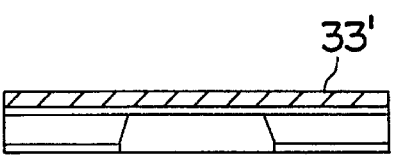

Subsequently, by using a sputtering apparatus, a film of Ta 33' (to be formed into the X-ray absorbing material) was formed to a thickness of 0.8 micron, and only an area of the Si substrate 31 corresponding to the X-ray transmission area was back etched by KOH (FIG. 5D). The back etching of the Si substrate may be made before the formation of the Ta film 33', or after bonding with the reinforcing member 34 of FIG. 5E or, alternatively, it may be done after formation of the X-ray absorbing material 33 of FIG. 5F. Where the back etching is to be done at the the same stage of FIG. 5D, the SiN film as formed simultaneously with the supporting film may be used as a protection film to the back etching. Alternatively, a film of $SiO_2$ or any other organic film may be formed separately. In that occasion, if the protection film consists of a material having an effect of reducing the bonding strength of the reinforcing member, it may be removed. Where SiN by CVD and Riverceram are used as in this embodiment, since the major constituents of them are the same, the bonding becomes very firm. Where the back etching is to be performed at the stage of FIG. 5E or 5F, the Si substrate 31 and the reinforcing member 34 are directly bonded to each other, arid the reinforcing member 34 may function as a protection film to the back etching.

Figure 5E:
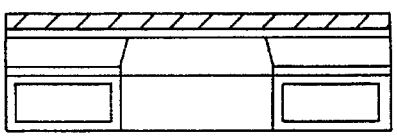

Then, the Si substrate 31 and the reinforcing member 34 having the film oxide 35 formed thereon were placed one upon another, and they were pressed at 5.0 Kg/cm² and were heat processed at 400° C. for eight (8) hours (FIG. 5E). If the bonding is done before formation of the X-ray absorbing material, it does not apply a large effect. However, closer the linear expansion coefficients of Si substrate 31 and the reinforcing member 35 are, smaller the distortion produced by the bonding is.

Figure 5F:
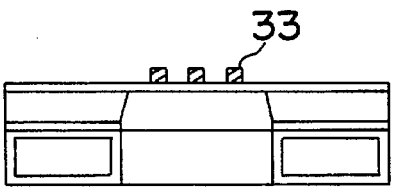

Subsequently, through electron beam pattern drawing process, a desired pattern was formed and the Ta film 33' was etched by using $CBrF_3$ gas, whereby the X-ray absorbing material 33 was formed (FIG. 5F). While in this example the Ta patterning was made after the bonding, it may be done before the bonding. In that occasion, annealing of Ta may be made at a temperature higher than the bonding temperature so as not produce a stress change in the absorbing material during the bonding process, to thereby maintain the positional precision.

With the bonding of the reinforcing member such as described above, an X-ray mask without distortion during the chucking operation or conveyance operation and being stable with respect to time or temperature and/or humidity end thus having a high positional precision, was provided.

[Embodiment 4]

FIGS. 6A–6G are schematic and sectional views for explaining manufacturing processes of an X-ray mask structure according to a fourth embodiment of the present invention.

Figure 6A:
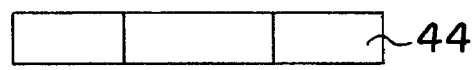
FIGS. 6A–6G are schematic views for explaining the manufacturing processes of an X-ray mask structure according to a still further embodiment of the present invention.
Figure 6B:
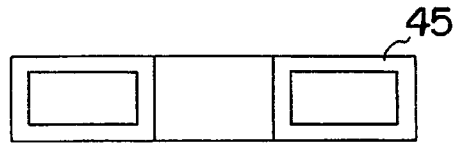
Figure 6C:

Reinforcing member 44 has a frame member having a window in its central portion as shown in FIG. 6A, and in this embodiment it was made of Sialon (Si—Al—O—N) having a linear expansion coefficient close to that of Si. SiC film 45 was formed on its surface through CVD process (FIG. 6B). While not shown in the drawings, the reinforcing member had been machined and shaped for convenience of conveyance and chucking of the same. The reinforcing member 44 having the SiC film 45 formed thereon was heat processed in an oxygen ambience at a temperature of 1200° C. for three (3) hours, and a SiC oxide (film oxide 45') was produced on it surface (FIG. 6C).

Figure 6D:
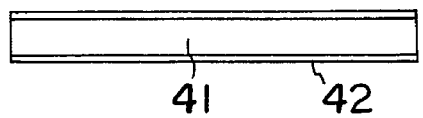

Then, upon Si substrate to be formed into a holding frame 41, a film of SiC (to be formed into a supporting film (X-ray transmission film 42)) was formed to a thickness of 2.0 micron through CVD process (FIG. 6D). Where the supporting film formation is done through sputtering, for example, no supporting film is formed on the bottom side of the substrate.

Figure 6E:
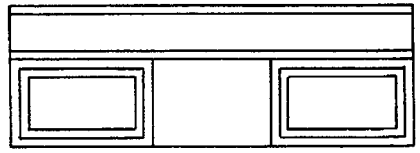

Then, the Si substrate 41 and the reinforcing member 44 having the SiC film 45 and its film oxide 45' formed thereon were placed one upon another, and they were pressed at 2.0 Kg/cm² and were heat processed at 800° C. for two (2) hours (FIG. 6E). If the bonding is done before formation of the X-ray absorbing material, it does not apply a large effect. However, closer the linear expansion coefficients of Si substrate 41 and the reinforcing member 44 are, smaller the distortion produced by the bonding is.

Where the supporting film 42 is made through CVD process, the bonding is provided by the formation of $SiC_xO_y$ between the SiC films. Thus, the bonding becomes very firm.

Figure 6F:
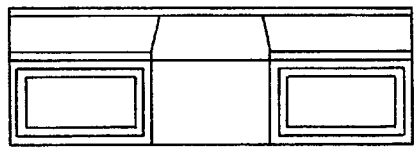
Figure 6G:
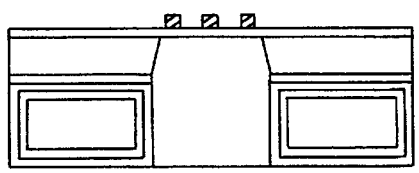

Then, only an area of the Si substrate 41 corresponding to the X-ray transmitting area was back etched by KOH (FIG. 6F). After formation of plating electrodes, an electron beam resist was used and a desired pattern was formed through an electron beam pattern drawing apparatus. Then, Au plating was performed, and the electrodes and tile resist material were removed, such that the X-ray absorbing material 23 of Au was formed (FIG. 6G).

With the bonding of the reinforcing member such as described above, very firm bonding was assured and thus an X-ray mask without distortion during the chucking operation or conveyance operation and being stable with respect to time or temperature and/or humidity and thus having a high positional precision, was provided.

[Embodiment 5]

Figure 7:
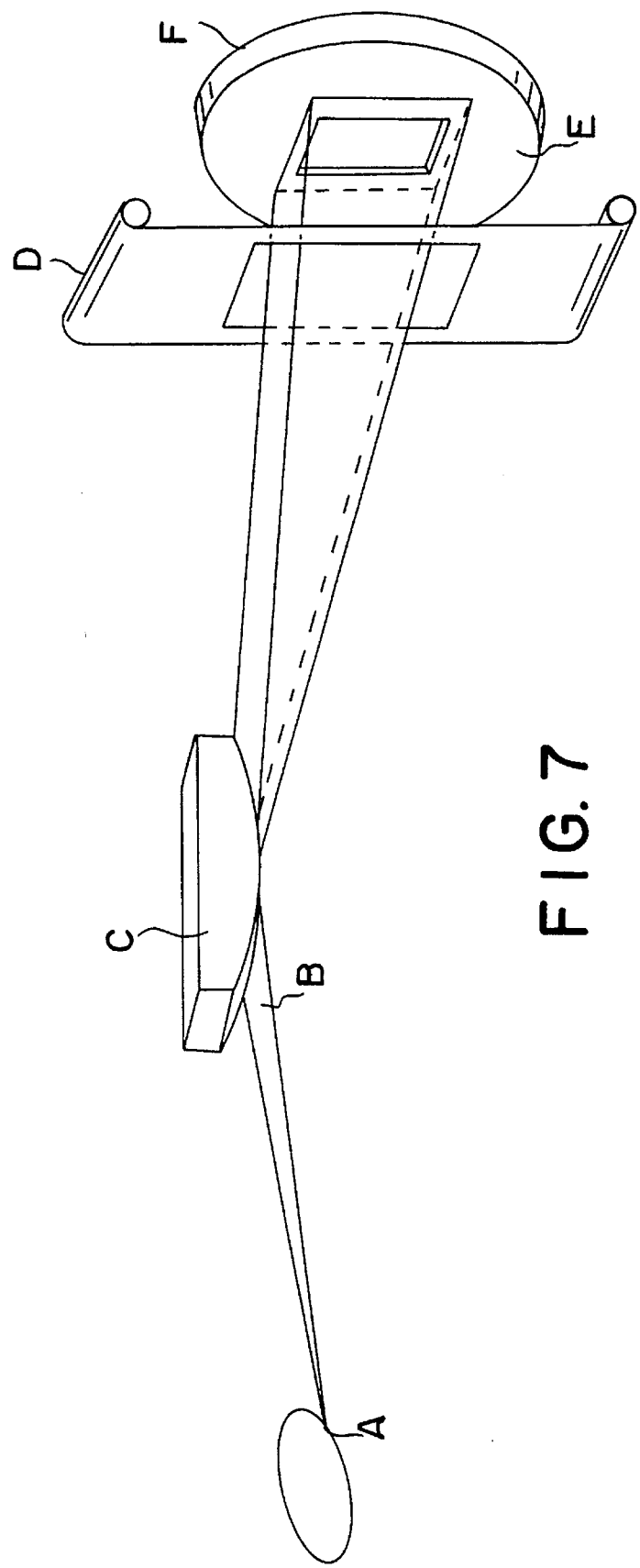
FIG. 7 is a schematic view of an X-ray exposure apparatus in which an X-ray mask structure according to the present invention is used.

Next, an embodiment of an X-ray exposure apparatus for manufacturing microdevices such as semiconductor devices, thin film magnetic heads or micromachines, for example, by using a mask as having been described above, will be explained. FIG. 7 shows the structure of the X-ray exposure apparatus of this embodiment. In the drawing, synchrotron radiation light B of sheet-beam shape emitted by a SR radiation source A is expanded by a convex mirror C in a direction perpendicular to the radiation orbital plane. The radiation light reflectively expanded by the convex mirror C is adjusted by a shutter D so as to provide uniform exposure amount over the illumination region. The radiation light passing the shutter is projected to an X-ray mask E. The X-ray mask E is one having been manufactured in accordance with any one of the processes as hag been described hereinbefore with reference to the first to forth embodiments. Exposure pattern formed on this X-ray mask is transferred and printed by exposure on a wafer F, through a step-and-repeat process or a step-and-scan process.

[Embodiment 6]

Next, an embodiment of semiconductor device manufacturing method which uses an X-ray mask structure as has been described above, will be explained.

Figure 8:
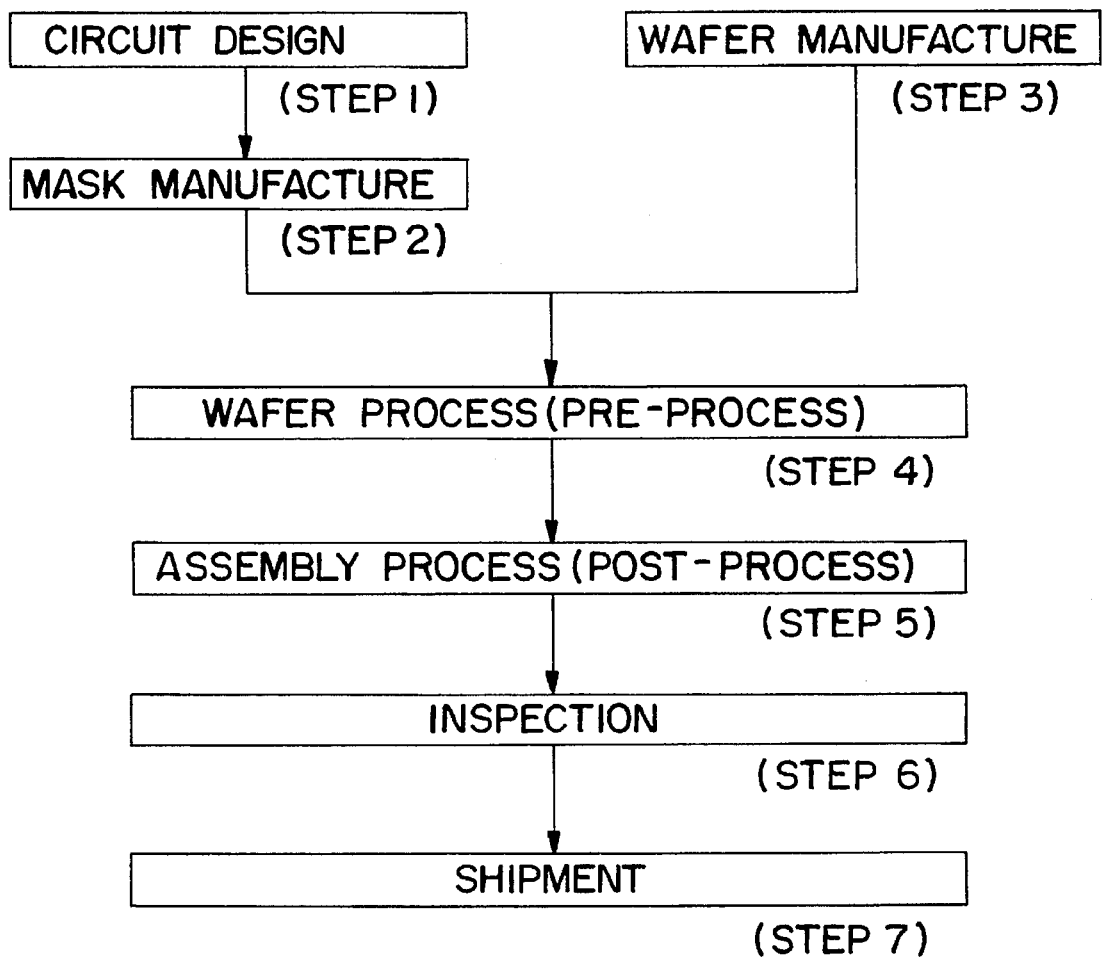
FIG. 8 is a flow chart of semiconductor device manufacturing processes to be made in an X-ray exposure apparatus in which an X-ray mask structure according to the present invention is used.

FIG. 8 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing an X-ray mask on the basis of the circuit pattern design, in accordance with any one of the processes having been described with reference to the first to fourth embodiments. Step 3 is a process for manufacturing a wafer by using a material such as silicon.

Step 4 is a wafer process which is called a pre-process wherein, by using the so prepared X-ray mask structure and wafer, circuits are practically formed on the wafer through X-ray lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 9:
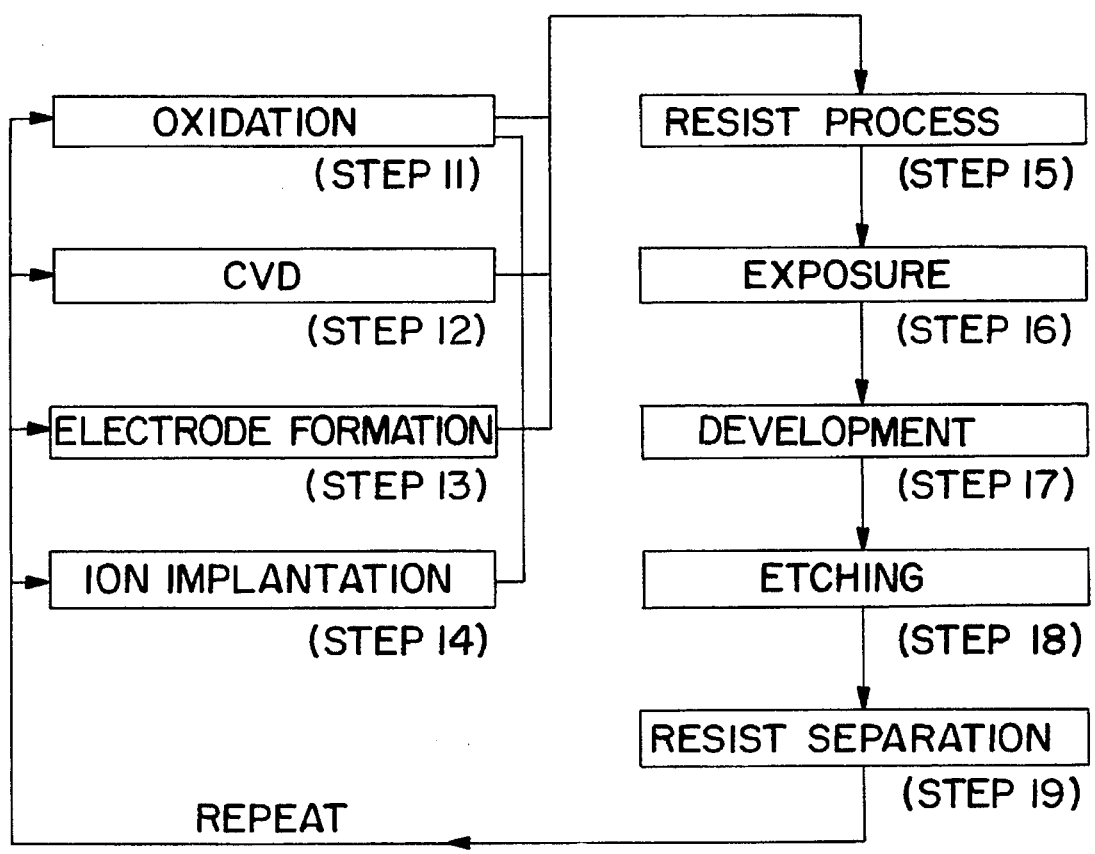
FIG. 9 is a flow chart of a wafer process, in the semiconductor device manufacturing processes to be made in an X-ray exposure apparatus in which an X-ray mask structure according to the present invention is used.
Figure 10:
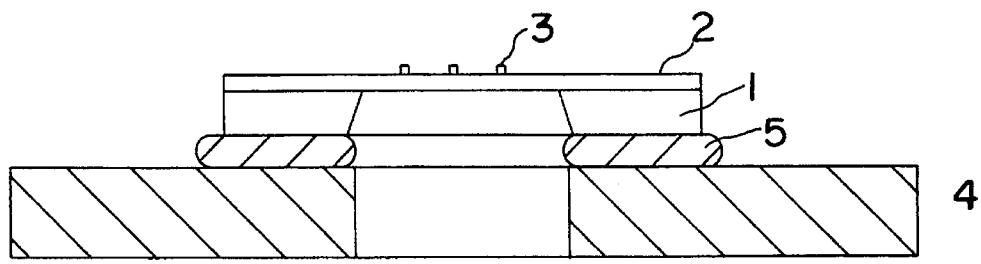
FIG. 10 is a sectional view of a known type X-ray mask structure.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the X-ray exposure process described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With this embodiment of the present invention, it is possible to produce a pattern exactly corresponding to the device design. Thus, with the device as manufactured through X-ray lithography by using an X-ray mask structure of the present invention, nigh density integration just being able to be performed through the X-ray lithography is assured. Also, the device has a good device characteristic.

While the invention has been described with reference to the structures disclosed herein, it is not confined to the details set forth and this application is intended to cover such modifications or changes as may come within the purposes of the improvements or the scope of the following claims.

What is claimed is:

1. A mask, comprising:
   a membrane on which a pattern is formed or to be formed;
   a holding frame for holding said membrane; and
   a reinforcing member for reinforcing said holding frame;
   wherein said reinforcing member comprises ceramics and wherein said reinforcing member and said holding frame are bonded to each other through a film oxide of the ceramics.

2. A mask according to claim 1, wherein said mask is an X-ray mask.

3. A mask according to claim 1, wherein said reinforcing member comprises a ceramics having a Young's modulus not less than 100 GPa and a linear expansion coefficient not greater than $1 \times 10^{-5} K^{-1}$.

4. A mask according to claim 1, wherein said reinforcing member comprises a ceramics of one of SiC, SiN, AlN, BN, $Al_2O_3$, $ZrO_2$, $SiC$—$ZrB_2$, $Al_2O_3$—TiC, $Al_2O_3$—$TiO_2$, AlN—BN, $Si_3N_4$—BN, Sialon and Cordierite.

5. A mask according to claim 1,
   wherein said reinforcing member has a major constituent the same as that of said membrane.

6. A mask according to claim 1, wherein said film oxide of ceramics comprises $SiO_2$.

7. A device manufacturing method which includes a step of projecting an exposure energy to a mask as recited in claim 1, whereby the pattern of the mask is transferred to a wafer.

8. A method according to claim 7, wherein the exposure energy comprises X-rays.

* * * * *

UNITED STATES PATENT AND TRADEMARK OFFICE
CERTIFICATE OF CORRECTION

PATENT NO.  : 5,589,304

DATED       : December 31, 1996

INVENTORS   : KEIKO CHIBA ET AL.

It is certified that error appears in the above-identified patent and that said Letters Patent is hereby corrected as shown below:

ON TITLE PAGE

[56] References Cited

```
"90162714   6/1990  Japan
  466096   10/1992  Japan
 93041347   2/1993  Japan"  should read
--2-162714   6/1990  Japan
  4-66096    3/1992  Japan
  5-41347    2/1993  Japan--.
```

COLUMN 1

Line 16,   "am" should read --an--;
Line 55,   "To" should read --to--.

COLUMN 3

Line 22,   "know" should read --known--;
Line 44,   "$_5K^{-1}$" should read --$^5K^{-1}$--.

UNITED STATES PATENT AND TRADEMARK OFFICE
CERTIFICATE OF CORRECTION

PATENT NO. : 5,589,304

DATED : December 31, 1996

INVENTORS : KEIKO CHIBA ET AL.

It is certified that error appears in the above-identified patent and that said Letters Patent is hereby corrected as shown below:

COLUMN 4

Line 1, "placed" should read --are placed--.
  Line 6, "free" should read --frame--.

COLUMN 5

Line 27, "(he" should read --the--;
  Line 38, "port,on" should read --portion--.

COLUMN 6

Line 51, "arid" should read --and--.

COLUMN 7

Line 9, "end" should read --and--;
  Line 52, "tile" should read --the--;
  Line 55, "with" should read --With--.

COLUMN 8

Line 62, "nigh" should read --high--.

UNITED STATES PATENT AND TRADEMARK OFFICE
CERTIFICATE OF CORRECTION

PATENT NO. : 5,589,304

DATED : December 31, 1996

INVENTORS : KEIKO CHIBA ET AL.

It is certified that error appears in the above-identified patent and that said Letters Patent is hereby corrected as shown below:

COLUMN 9

Line 15, delete "a" (1st occurrence)

COLUMN 10

Line 2, "ceramics" should read --ceramic--.

Signed and Sealed this

Twenty-fourth Day of June, 1997

Attest:

Attesting Officer

BRUCE LEHMAN

Commissioner of Patents and Trademarks